United States Patent
Rai et al.

(10) Patent No.: US 7,259,702 B2
(45) Date of Patent: Aug. 21, 2007

(54) MEMORY DEVICE

(75) Inventors: Toshiki Rai, Ogaki (JP); Sadao Yoshikawa, Gifu (JP)

(73) Assignee: Sanyo Electric Co., Ltd. (JP)

(*) Notice: Subject to any disclaimer, the term of this patent is extended or adjusted under 35 U.S.C. 154(b) by 43 days.

(21) Appl. No.: 11/250,764

(22) Filed: Oct. 14, 2005

(65) Prior Publication Data

US 2006/0123164 A1 Jun. 8, 2006

(30) Foreign Application Priority Data

Oct. 29, 2004 (JP) ............................. 2004-315406

(51) Int. Cl.
*H03M 9/00* (2006.01)
(52) U.S. Cl. .................. 341/100; 341/101; 711/62; 711/63; 711/65; 711/66; 711/71
(58) Field of Classification Search .......... 711/66, 711/71
See application file for complete search history.

(56) References Cited

U.S. PATENT DOCUMENTS

| 5,802,399 | A | * | 9/1998 | Yumoto et al. ............... 710/66 |
| 5,974,493 | A | * | 10/1999 | Okumura et al. ........... 710/307 |
| 6,088,755 | A | * | 7/2000 | Kobayashi et al. ......... 710/300 |
| 6,317,377 | B1 | * | 11/2001 | Kobayashi .................. 365/220 |
| 6,748,469 | B1 | * | 6/2004 | Caldwell et al. .............. 710/71 |

* cited by examiner

*Primary Examiner*—Khai Nguyen
(74) *Attorney, Agent, or Firm*—Cantor Colburn LLP

(57) ABSTRACT

The present invention provides a memory device including a serial-parallel conversion section that converts serial data into parallel data, a parallel-serial conversion section that converts parallel data into serial data, and a parallel-parallel conversion section that changes a bit width of the parallel data. This memory device connects one external terminal to the serial-parallel conversion section and another external terminal to the parallel-serial conversion section when access using a serial interface is performed. On the other hand, the memory device connects a plurality of external terminals to the parallel-parallel conversion section when access using a parallel interface is performed, thereby enabling the memory device to occasionally realize parallel transfer of data while using a conventional package.

4 Claims, 7 Drawing Sheets

MEMORY DEVICE

CROSS-REFERENCE TO RELATED APPLICATION

This application is based upon, and claims the benefit of priority from, earlier Japanese Patent Application No. 2004-315406 filed on Oct. 29, 2004 so that its entire disclosure, including specification, claims, drawings, and abstract, is incorporated herein by reference.

BACKGROUND OF THE INVENTION

1. Field of the Invention

This invention relates to a memory device that selectively accepts accesses using a serial interface and accesses using a parallel interface.

2. Description of the Related Art

A memory device, such as a flash memory, uses an architecture that is capable of accepting access using a simple four-wire serial interface. The memory device using a serial interface is usually incorporated into an 8-pin or 16-pin chip package, for example, as shown in FIG. 6. Therefore, compared with a memory device using a parallel interface, the serial interface equipped memory device can be easily downsized and accordingly the cost of the chip package can be reduced.

For example, when an 8-pin chip package is used, four of the eight pins are allocated to terminals of a four-wire serial interface, i.e. an address/data input terminal (SI), a data output terminal (SO), a chip select terminal (CS#), and a system clock input terminal (SCK), while 2 pins are allocated to power source terminals (VDD and VSS). The remaining pins, i.e. two pins, are allocated to control terminals, such as a write protect terminal that determines allowance when an access for writing/erasing is received, a reset terminal that stops processing in response to an interrupt request, or a hold terminal that interrupts the processing and holds the condition.

FIG. 7 shows a memory device 100 equipped with a serial interface that includes an address buffer/latch section 10, a control logic section 12, a data register 14, an X decoder 16, a Y decoder 18, a memory array 20, a serial-parallel conversion section 22, and a parallel-serial conversion section 24.

FIG. 8 is a timing diagram showing the control processing for reading data out of the memory device 100.

First, the electrical potential of the chip select terminal (CS#) is changed to a low level to select the memory device 100 as an object to be accessed. In response to the potential change of the chip select terminal (CS#) to the low level, the control logic section 12 brings other sections into a command receivable state.

Next, a data reading command (i.e. 03h shown in FIG. 8), that instructs reading of data, is input from the address/data input terminal (SI). The command is arranged, for example, as 8-bit data and is serially input to the serial-parallel conversion section 22, bit by bit, in synchronism with a system clock input from the system clock input terminal (SCK). The serial-parallel conversion section 22 converts the command from the serial data into parallel data corresponding to a bit width of an internal bus (e.g. 8 bits). The converted parallel data is sent to the control logic section 12.

The control logic section 12 analyzes the command. For example, when the input command is a data reading command (03h), the control logic section 12 brings other sections into an address value receivable state.

Next, an address value (Add.) is input from the address/data input terminal (SI). The address value is, for example, expressed as 24-bit serial data and is input to the serial-parallel conversion section 22, bit by bit, in synchronism with the system clock. The serial-parallel conversion section 22 successively converts the address value from the serial data into parallel data corresponding to the bit width of the internal bus (e.g. 8 bits). The control logic section 12 causes the serial-parallel conversion section 22 to successively transfer the address value, being converted into the parallel data, to the address buffer/latch section 10.

The address buffer/latch section 10, when the address value has been received, outputs a control signal to each of the X decoder 16 and the Y decoder 18 to identify a corresponding memory element in the memory array 20, and the data stored in this memory element is read out. The readout data is stored, via the Y decoder 18, into the data register 14. The parallel-serial conversion section 24 converts the data stored in the data register 14 into serial data and outputs the converted serial data from the data output terminal (SO) in synchronism with the system clock.

The address buffer/latch section 10 successively increases the address value so that the memory array 20 can successively read the data out of a memory element identified by the next address value.

However, according to such a memory device using a four-wire serial interface, the input/output of address value and data is performed by 1-bit serial communication, and accordingly the transfer rate is very low compared with that of the memory device using a parallel interface.

SUMMARY OF THE INVENTION

In view of the foregoing problems in the prior art technique, it is an object of the present invention to provide a high performance memory device.

To accomplish the above and other related objects, the present invention provides a memory device equipped with a memory array that includes a plurality of memory elements respectively identified by unique address values, wherein the memory device reads a data out of a memory element identified by an address value when the address value is input from at least one of external terminals, and outputs the readout data to at least one of the external terminals. The memory device of this invention includes a serial-parallel conversion section, a parallel-serial conversion section, a parallel-parallel conversion section, and a multiplexer. The serial-parallel conversion section has the capability of converting serial data into parallel data. The parallel-serial conversion section has the capability of converting parallel data into serial data. The parallel-parallel conversion section has the capability of changing a bit width of the parallel data. The multiplexer can connect at least some of the external terminals to one of the serial-parallel conversion section, the parallel-serial conversion section, and the parallel-parallel conversion section. The multiplexer, when access using a serial interface is performed, connects one of the external terminals to the serial-parallel conversion section and connects another of the external terminals to the parallel-serial conversion section. Furthermore the multiplexer, when access using a parallel interface is performed, connects a plurality of the external terminals to the parallel-parallel conversion section.

The above and other objects, features and advantages of the present invention will become more apparent from the following detailed description of an exemplary embodiment with reference to the attached drawings

BRIEF DESCRIPTION OF THE DRAWINGS

The accompanying drawings, which are incorporated in and constitute a part of the specification, illustrate a preferred embodiment of the invention and, together with the description, serve to explain the principles of the invention, in which.

DESCRIPTION OF A PREFERRED EMBODIMENT

Hereinafter, a preferred embodiment of the present invention will be explained with reference to attached drawings.

Figure 1:
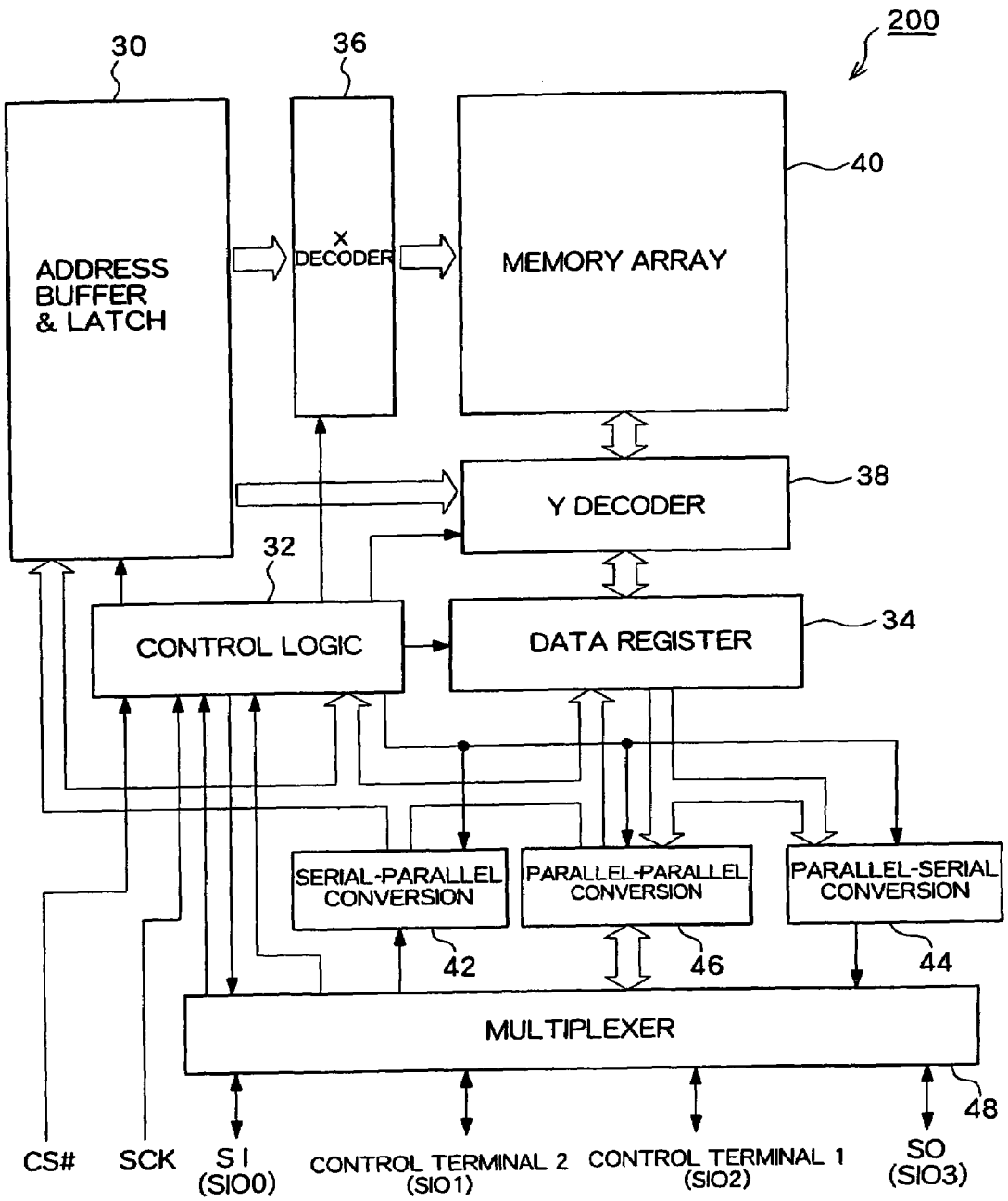
FIG. 1 is a block diagram showing the arrangement of a memory device in accordance with a preferred embodiment of the present invention.

FIG. 1 shows a memory device 200 in accordance with a preferred embodiment of the present invention, which includes an address buffer/latch section 30, a control logic section 32, a data register 34, an X decoder 36, a Y decoder 38, a memory array 40, a serial-parallel conversion section 42, a parallel-serial conversion section 44, a parallel-parallel conversion section 46, and a multiplexer 48.

The memory device 200 uses a package similar to that of a conventional memory device using a serial interface. The memory device 200 is equipped with a multiplexer 48 that is capable of switching terminal connection in response to each of access using a serial interface and access using a parallel interface.

Figure 2:
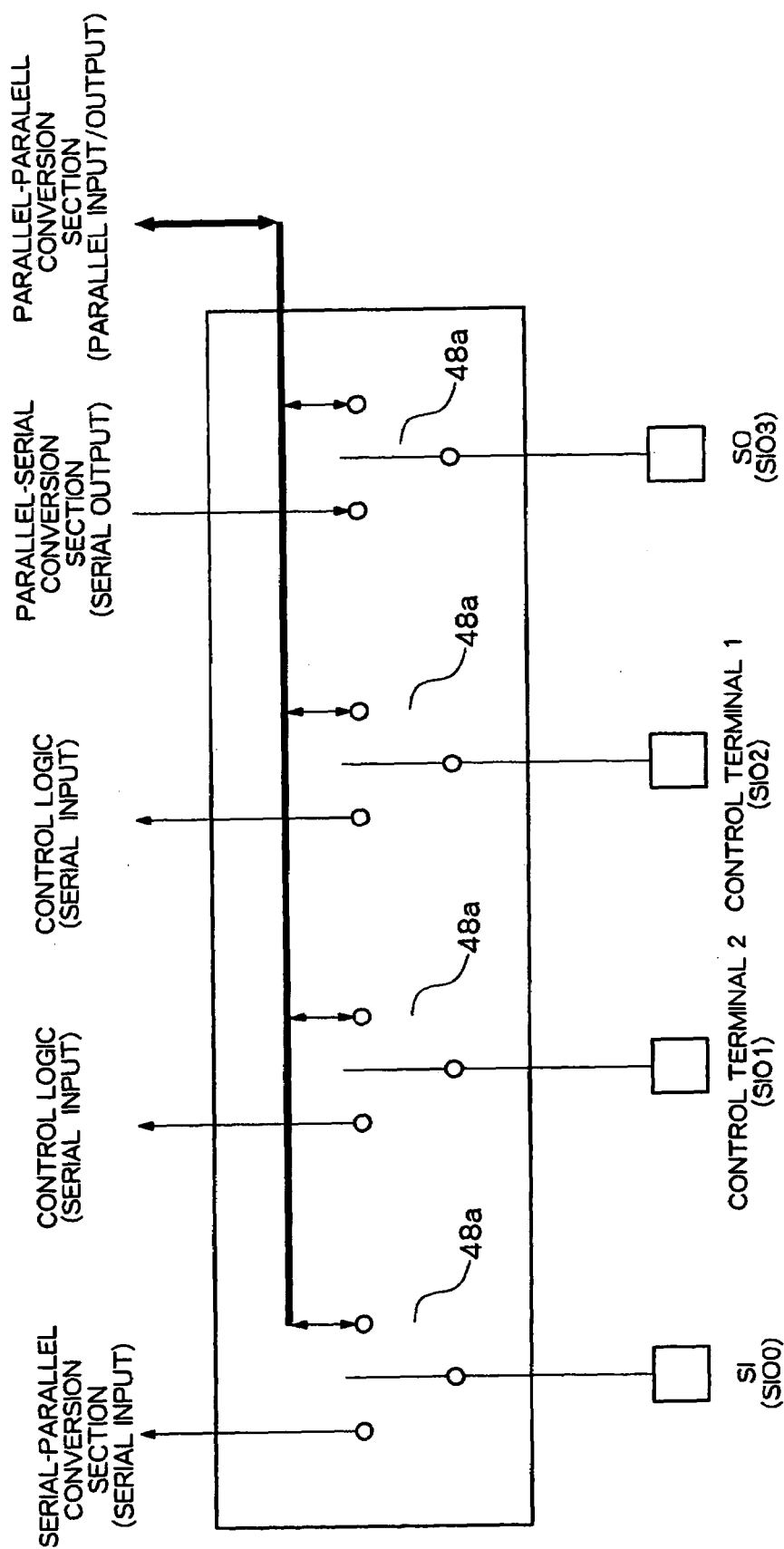
FIG. 2 is a diagram showing the arrangement of a multiplexer in accordance with the preferred embodiment of the present invention.

As shown in FIG. 2, the multiplexer 48 is equipped with a plurality of changeover switches 48a. The multiplexer 48, upon receipt of a switching control signal from the control logic section 32, connects respective external terminals of a chip package to one of the serial-parallel conversion section 42, the parallel-serial conversion section 44, and the parallel-parallel conversion section 46.

For example, in a case where an 8-pin chip package is used, the changeover switches 48a are connected to left-hand terminals when access using a serial interface is performed. In this case, the allocation of respective terminals is identical with that shown in FIG. 6. More specifically, the data output terminal (SO) is connected to the parallel-serial conversion section 44. The address/data input terminal (SI) is connected to the serial-parallel conversion section 42. The first control terminal (C0) and the second control terminal (C1) are connected to the control logic section 32.

Figure 3:
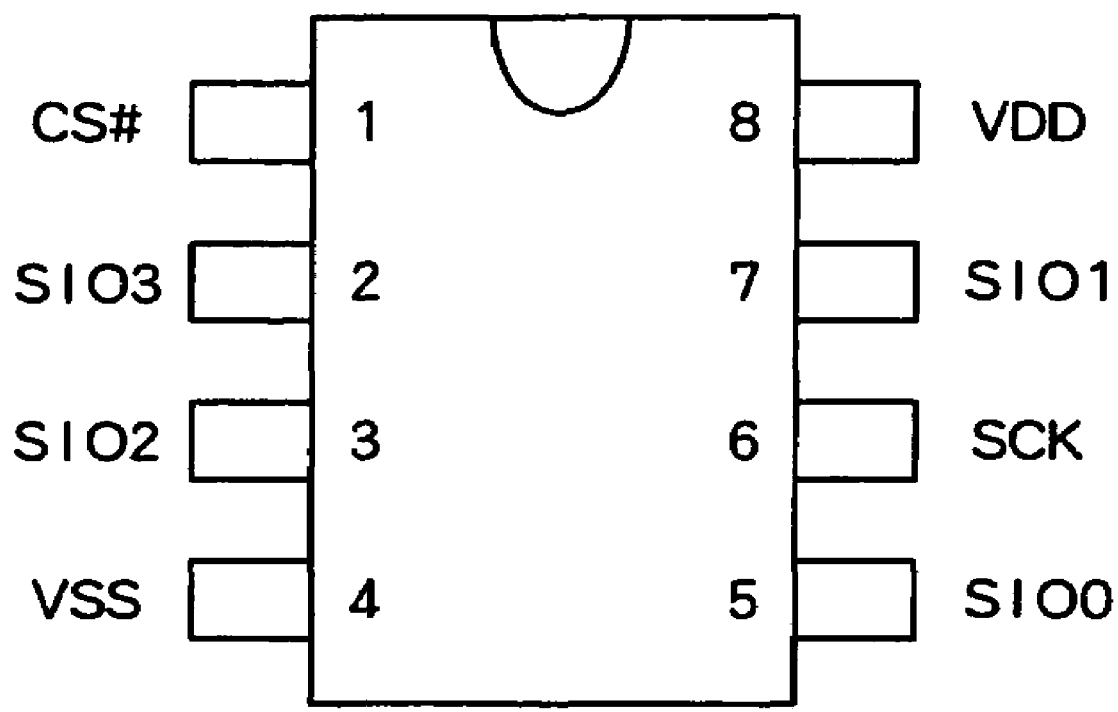
FIG. 3 is a diagram showing the allocation of pins of the memory device in a case where access using a parallel interface is performed.

On the other hand, the changeover switches 48a are connected to right-hand terminals when access for reading data via the parallel interface is performed. In this case, the terminals are allocated, for example, as shown in FIG. 3. The data output terminal (SO) is allocated to a fourth data input/output terminal (SIO3). The first control terminal (C0) is allocated to a third data input/output terminal (SIO2). The second control terminal (C1) is allocated to a second data input/output terminal (SIO1). Finally, the address/data input terminal (SI) is allocated to a first data input/output terminal (SIO0). With this arrangement, access using the parallel interface becomes feasible. Namely, all of the data output terminal (SO), the address/data input terminal (SI), the first control terminal (C0) and, the second control terminal (C1) are connected to the parallel-parallel conversion section 46.

Hereinafter, the data read out processing using a serial interface, the data read out processing using a parallel interface, and the processing for resuming the processing using the serial interface will be successively explained.

Data Read Out Processing Via Serial Interface

Figure 6:
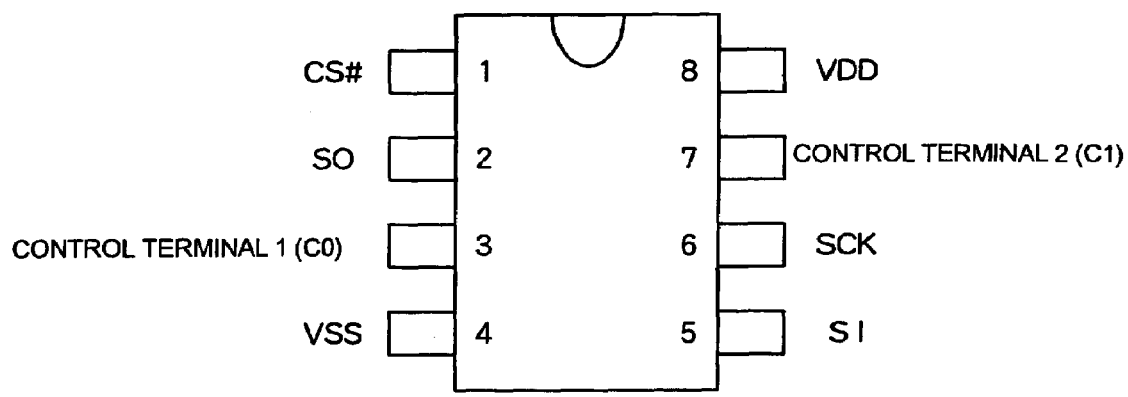
FIG. 6 is a diagram showing the allocation of pins of a conventional memory device in a case where access using a serial interface is performed.
Figure 7:
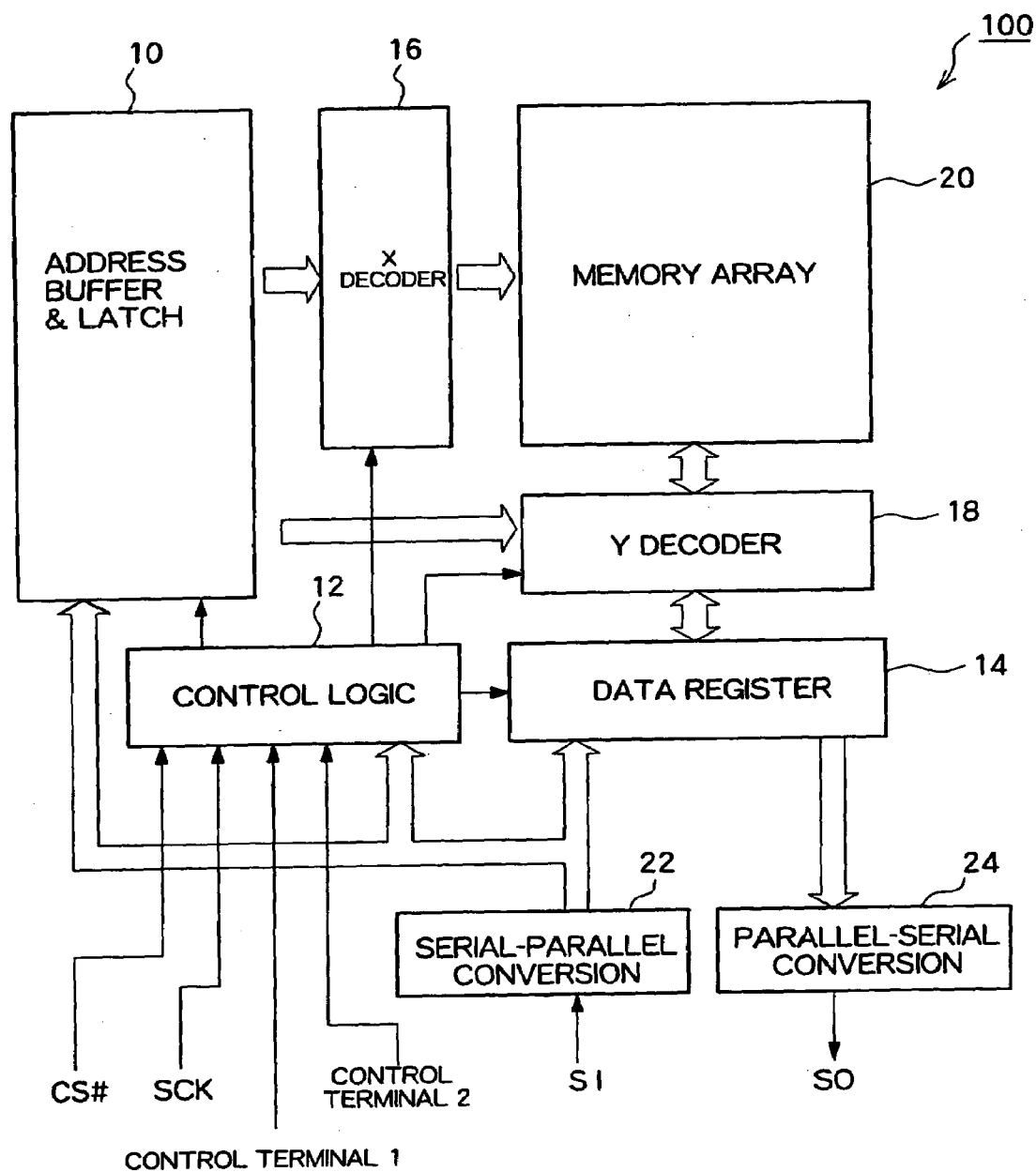
FIG. 7 is a block diagram showing the arrangement of a memory device of the background art.

The memory device 200, under normal conditions, accepts accesses using a serial interface. The changeover switches 48a of the multiplexer 48 are connected to the left-hand terminals so that respective terminals are allocated as shown in FIG. 6.

Figure 8:
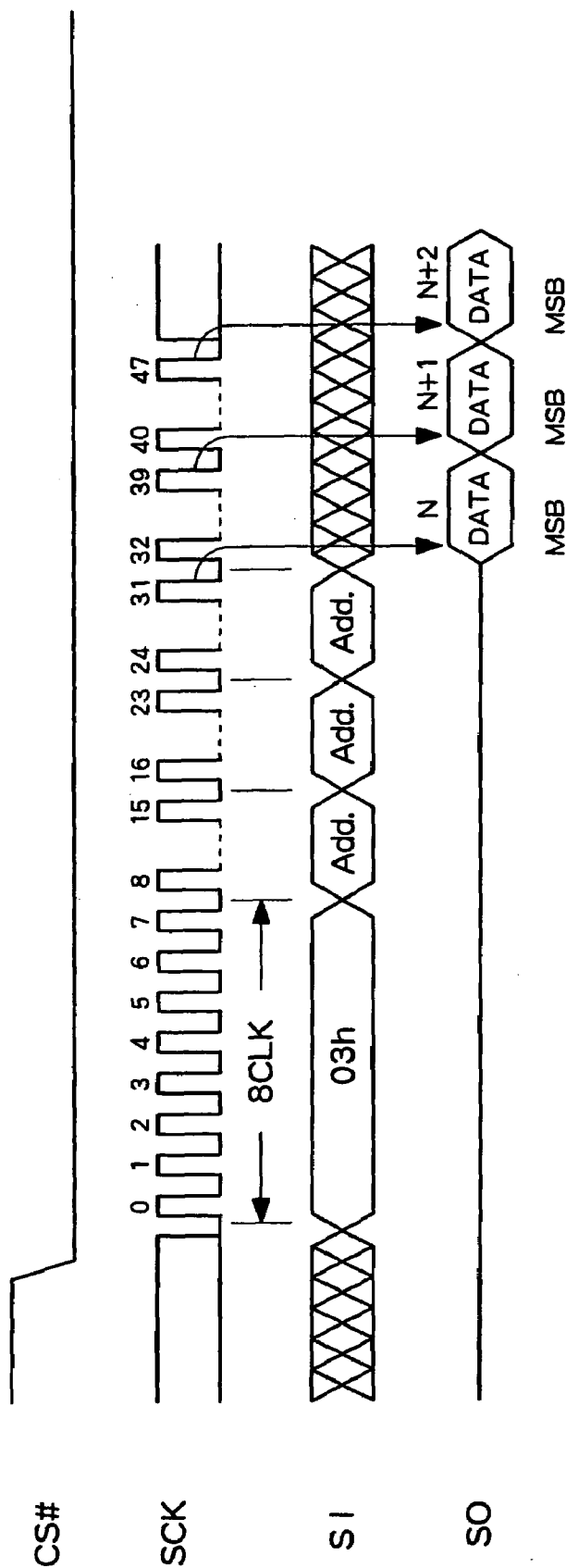
FIG. 8 is a timing diagram showing the processing for reading out data via the serial interface according to the memory device of the background art.

Accordingly, like the above-described conventional memory device, the processing for reading the data out of the memory device 200 is carried out according to the timing diagram shown in FIG. 8. This processing is already explained for the above-described conventional memory device, and accordingly will not be explained hereinafter.

Data Read Out Processing Via Parallel Interface

Figure 4:
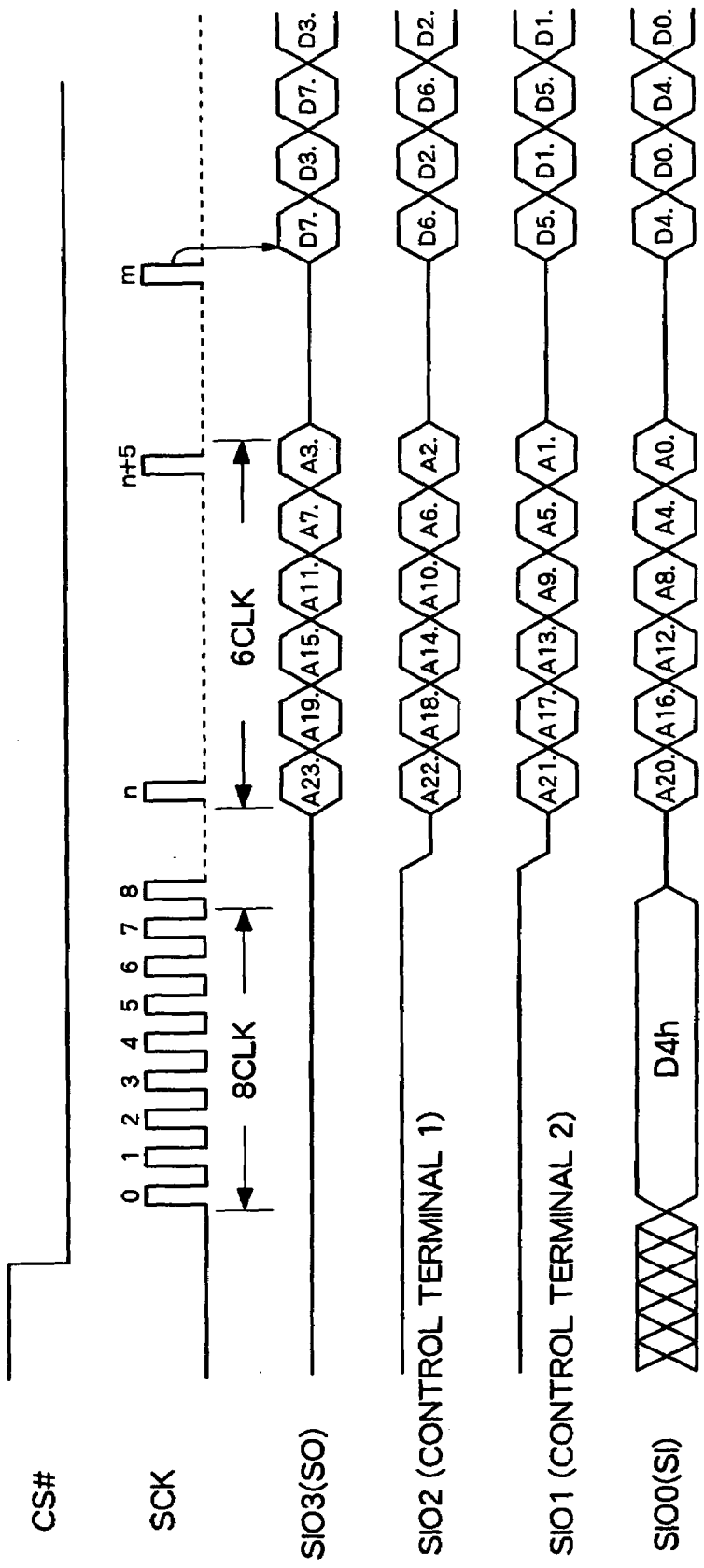
FIG. 4 is a timing diagram showing the data read out processing via the parallel interface in accordance with the preferred embodiment of the present invention.

Access using the parallel interface is carried out according to the timing diagram shown in FIG. 4. Under initial conditions, the changeover switches 48a of the multiplexer 48 are connected to the left-hand terminals so that the terminals are allocated as shown in FIG. 6.

First, the electrical potential of the chip select terminal (CS#) is changed to a low level to select the memory device 200 as an object to be accessed. In response to the potential change of the chip select terminal (CS#) to the low level, the control logic section 32 brings other sections into a command receivable state.

Next, a data reading command (i.e. D4h shown in FIG. 4), that instructs reading of data via the parallel interface, is input from the address/data input terminal (SI). The command is arranged, for example, as 8-bit data and is serially input to the serial-parallel conversion section 42, bit by bit, in synchronism with a system clock input from the system clock input terminal (SCK). The serial-parallel conversion section 42 converts the command from the serial data into parallel data corresponding to a bit width of an internal bus (e.g. 8 bits). The converted parallel data is sent to the control logic section 32.

The control logic section 32 analyzes the command. When it has received the command (D4h) instructing data reading via the parallel interface, the control logic section 32 brings other sections into an address value receivable state and causes the multiplexer 48 to switch the changeover switches 48*a* to the right-hand terminals. With this operation, all of the data output terminal (SO), the address/data input terminal (SI), the first control terminal (C0), and the second control terminal (C1) are connected to the parallel-parallel conversion section 46. The data output terminal (SO) is allocated to the fourth data input/output terminal (SIO3). The first control terminal (C0) is allocated to the third data input/output terminal (SIO2). The second control terminal (C1) is allocated to the second data input/output terminal (SIO1). Finally, the address/data input terminal (SI) is allocated to the first data input/output terminal (SIO0).

In this case, it is preferable that the switching of the multiplexer 48 is performed at the time when the electrical potential of the chip select terminal (CS#) is changed to the low level after it has returned once to a high level. It is also preferable that the switching of multiplexer 48 is performed after the control logic 32 has counted up a predetermined number of system clocks in synchronism with each system clock input from the system clock terminal (SCK).

Next, an address value (Add.) is input from a total of four data input/output terminals (SIO0 to SIO3), 4 bits at a time, simultaneously in parallel with each other. The address value is, for example, expressed as a 24-bit parallel data and is input to the parallel-parallel conversion section 46, 4 bits at a time, in synchronism with the system clock. The parallel-parallel conversion section 46 successively converts the address value into parallel data corresponding to the bit width of the internal bus (e.g. 8 bits). The control logic section 32 causes the parallel-parallel conversion section 46 to successively transfer the address value, being converted into the parallel data having the bit width of the internal bus, to the address buffer/latch section 30.

The address buffer/latch section 30, when receiving the address value, outputs a control signal to each of the X decoder 36 and the Y decoder 38 to identify a corresponding memory element in the memory array 40, and the data stored in this memory element is read out. The readout data is stored, via the Y decoder 38, in the data register 34. The parallel-parallel conversion section 46 converts the data stored in the data register 34, having the bit width of the internal bus, into parallel data of 4 bits, and outputs the converted parallel data from four data input/output terminals (SIO0 to SIO3) in synchronism with the system clock.

The address buffer/latch section 30 successively increases the address value so that the memory array 40 can successively read the data out of a memory element identified by the next address value.

According to this embodiment, the input/output of address value and data is performed in synchronism with the system clock. However, it is possible to use a double data rate (DDR) or other high-speed transfer technique.

Processing for Resuming Access Via Serial Interface

Figure 5:
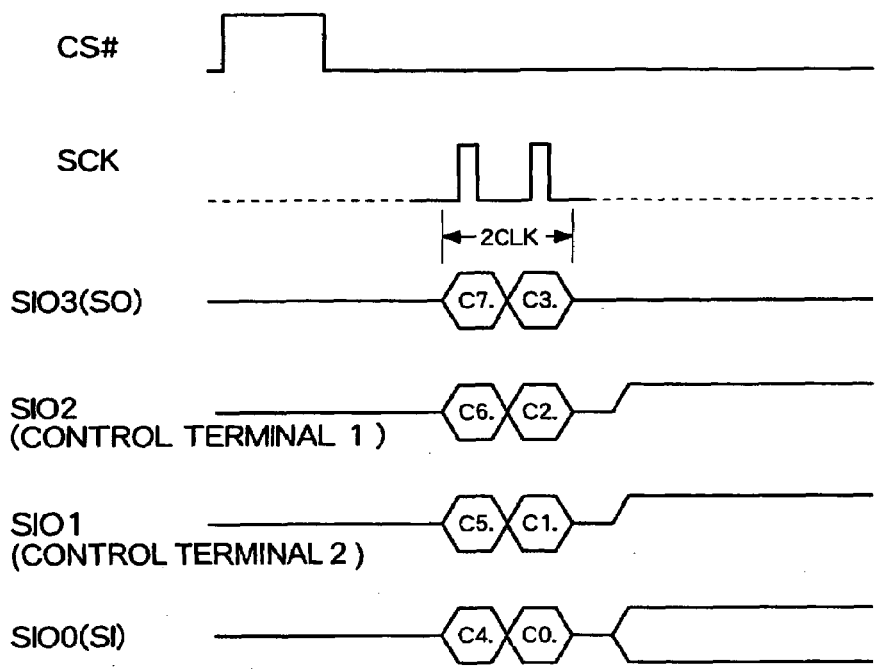
FIG. 5 is a timing diagram showing the processing for switching from the parallel interface to the serial interface in accordance with the preferred embodiment of the present invention.

The processing for switching from access using the parallel interface to access using the serial interface will be explained hereinafter with reference to FIG. 5. The electrical potential of the chip select terminal (CS#) is returned to the high level to cancel the selection of the memory device. Then, the electrical potential of the chip select terminal (CS#) is again changed to the low level. The pulse input to this chip select terminal (CS#) is used as a trigger to execute the processing for receiving input of a new command. Namely, the control logic section 32 brings the memory device 200 into a command input receivable state. Subsequently, the command is input as parallel data, which are input simultaneously 4 bits at a time, from four data input/output terminals (SIO0 to SIO3).

The command is, for example, expressed as 8-bit data and is input to the parallel-parallel conversion section 46 as parallel data, 4 bits at a time, in synchronism with the system clock. The parallel-parallel conversion section 46 converts the command into data having the bit width of the internal bus (e.g. 8 bits) and transmits the converted data to the control logic section 32.

The control logic section 32 analyzes the command. When the command instructs return to access using the serial interface, the control logic section 32 causes the multiplexer 48 to switch the changeover switches 48*a* to left-hand terminals. With this operation, ordinary access using the serial interface becomes feasible.

In this case, it is preferable for the switching of multiplexer 48 to be performed at the time when the electrical potential of the chip select terminal (CS#) is changed to the low level after it is has been returned to the high level. It is also preferable for the switching of multiplexer 48 to be performed after a predetermined waiting time has passed in synchronism with the system clock input from the system clock terminal (SCK).

As described above, according to this embodiment, the size of the package is substantially the same as that of a conventional memory device using a serial interface. Meanwhile, it becomes possible to realize a memory device having the capability of occasionally accepting access using the parallel interface.

While the present invention has been described with reference to an exemplary embodiment, it is to be understood that the invention is not limited to the disclosed exemplary embodiment. The scope of the following claims is to be accorded the broadest interpretation so as to encompass all modifications, equivalent structures and functions.

What is claimed is:

1. A memory device equipped with a memory array that includes a plurality of memory elements respectively identified by unique address values, wherein the memory device reads data out of a memory element identified by an address value when the address value is input from at least one of external terminals and outputs the readout data to at least one of the external terminals, comprising:

a serial-parallel conversion section for converting serial data into parallel data;

a parallel-serial conversion section for converting parallel data into serial data;

a parallel-parallel conversion section for changing a bit width of the parallel data; and a multiplexer for connecting at least some of the external terminals to one of the serial-parallel conversion section, the parallel-serial conversion section, and the parallel-parallel conversion section, wherein the multiplexer, when access using a serial interface is performed, connects one of the external terminals to the serial-parallel conversion section and connects another of the external terminals to the parallel-serial conversion section, and the multiplexer, when access using a parallel interface is performed, connects a plurality of the external terminals to the parallel-parallel conversion section.

2. The memory device according to claim 1, wherein the multiplexer, when access using the serial interface is performed, connects a first external terminal of the external terminals to the serial-parallel conversion section and connects a second external terminal of the external terminals to the parallel-serial conversion section, and the multiplexer, when access using the parallel interface is performed, connects the first and second external terminals to the parallel-parallel conversion section.

3. The memory device according to claim 1, wherein the multiplexer, when access using the parallel interface is performed, connects a predetermined external terminal of the external terminals, which is not connected to the serial-parallel conversion section or the parallel-serial conversion section at the access using the serial interface, to the parallel-parallel conversion section.

4. The memory device according to claim 2, wherein the multiplexer, when access using the parallel interface is performed, connects a predetermined external terminal of the external terminals, which is not connected to the serial-parallel conversion section or the parallel-serial conversion section at the access using the serial interface, to the parallel-parallel conversion section.

* * * * *